US007867824B2

(12) United States Patent
Fisher et al.

(10) Patent No.: US 7,867,824 B2
(45) Date of Patent: Jan. 11, 2011

(54) METHODS OF FABRICATING A LARGE AREA TRANSDUCER ARRAY

(75) Inventors: Rayette Ann Fisher, Niskayuna, NY (US); William Edward Burdick, Jr., Niskayuna, NY (US); James Wilson Rose, Guilderland, NY (US)

(73) Assignee: General Electric Company, Schenectady, NY (US)

( * ) Notice: Subject to any disclaimer, the term of this patent is extended or adjusted under 35 U.S.C. 154(b) by 16 days.

(21) Appl. No.: 12/117,608

(22) Filed: May 8, 2008

(65) Prior Publication Data

US 2008/0213933 A1 Sep. 4, 2008

Related U.S. Application Data

(62) Division of application No. 11/003,054, filed on Dec. 3, 2004, now Pat. No. 7,375,420.

(51) Int. Cl.
*H01L 21/00* (2006.01)
(52) U.S. Cl. .......................... 438/109; 438/16; 438/19; 257/686; 257/E25.013; 257/E21.614
(58) Field of Classification Search .................. 257/685, 257/686, E25.013, E25.021, E25.027, E23.085, 257/E21.614, E25.018; 438/14–19, 109
See application file for complete search history.

(56) References Cited

U.S. PATENT DOCUMENTS

| 4,491,760 | A | * | 1/1985 | Linvill ........................ 310/334 |
| 4,804,132 | A | | 2/1989 | DiFrancesco | |
| 5,083,697 | A | | 1/1992 | DiFrancesco | |
| 5,334,809 | A | | 8/1994 | DiFrancesco | |
| 5,430,614 | A | | 7/1995 | DiFrancesco | |
| 5,471,151 | A | | 11/1995 | DiFrancesco | |
| 5,506,514 | A | | 4/1996 | DiFrancesco | |
| 5,565,280 | A | | 10/1996 | DiFrancesco | |

(Continued)

FOREIGN PATENT DOCUMENTS

WO     WO0126137     4/2001

OTHER PUBLICATIONS http://merriam-webster.com/dictionary/electronic , accessed Nov. 10, 2009.*

(Continued)

*Primary Examiner*—Fernando L Toledo
(74) *Attorney, Agent, or Firm*—Fletcher Yoder

(57) ABSTRACT

Methods of fabricating a tiled transducer array are disclosed. Embodiments of the methods include fabricating a wafer comprising a plurality of transducers, dicing the wafer to form individual transducers, testing the individual transducers to identify a plurality of known good transducers, preparing a substrate having a front side and a backside wherein the backside of the substrate comprises a plurality of connectors, positioning the plurality of known good transducers on the front side of the substrate and aligning the plurality of transducers in a horizontal direction and a vertical direction to form a transducer array, and electrically coupling the connectors on the substrate to the plurality of known good transducers, wherein the connectors are arranged such that each of the plurality of known good transducers may be electrically coupled to an electronic device disposed on the backside of the substrate, through a respective one or more of the plurality of connectors.

20 Claims, 5 Drawing Sheets

U.S. PATENT DOCUMENTS

| | | | |
|---|---|---|---|
| 5,634,265 | A | 6/1997 | DiFrancesco |
| 5,637,800 | A * | 6/1997 | Finsterwald et al. .......... 73/642 |
| 5,642,055 | A | 6/1997 | DiFrancesco |
| 5,670,251 | A | 9/1997 | DiFrancesco |
| 5,835,359 | A | 11/1998 | DiFrancesco |
| 6,096,982 | A | 8/2000 | DiFrancesco |
| 6,430,109 | B1 | 8/2002 | Khuri-Yakub et al. |
| 6,510,195 | B1 | 1/2003 | Chappo et al. |
| 6,630,203 | B2 | 10/2003 | Bahn et al. |
| 6,683,665 | B1 | 1/2004 | Matthies |
| 6,876,086 | B2 | 4/2005 | Sekine et al. |
| 2001/0041904 | A1 * | 11/2001 | Heller et al. ................. 606/181 |
| 2002/0153492 | A1 * | 10/2002 | Sekine et al. .......... 250/370.11 |
| 2005/0094763 | A1 * | 5/2005 | Sherman et al. ................ 378/19 |
| 2007/0132479 | A1 * | 6/2007 | Fenk .......................... 324/765 |

OTHER PUBLICATIONS http://merriam-webster.com/dictionary/device , accessed Nov. 10, 2009.*

* cited by examiner

METHODS OF FABRICATING A LARGE AREA TRANSDUCER ARRAY

CROSS REFERENCE TO RELATED APPLICATIONS

The present patent application is a divisional of, and claims priority to, the non-provisional patent application Ser. No. 11/003,054 filed on Dec. 3, 2004 and titled "Large Area Transducer Array".

BACKGROUND

The present invention relates generally to the field of transducer arrays, and more specifically to engineering transducer arrays.

Transducers are devices that transform input signals of one form into output signals of a different form. Commonly used transducers include light sensors, heat sensors, and acoustic sensors. An example of an acoustic sensor is an ultrasonic transducer. In ultrasound devices, the transducers transform signals of electrical energy into acoustic energy or produce electrical signals from absorbed sound waves.

Various applications, such as biomedical non-invasive diagnostics and non-destructive testing (NDT) of materials entail the use of transducer arrays, where the transducers are often configured in two-dimensions (that is, the X-Y plane). For example, ultrasonic transducer arrays are used in medical imaging, non-destructive evaluation (NDE) and other applications.

Applications such as medical and industrial imaging, NDE, security, baggage scanning, astrophysics and medicine may entail the use of transducers that encompass large areas. In the field of medical diagnostics, such as, but not limited to ultrasound and mammography, it may be desirable to employ transducers that encompass large areas. For instance, in an x-ray imaging system, large area transducers may be necessary to encompass the area of the x-ray detector.

In the field of NDT many inspection methods utilize a single contact sensor that only interrogates a small area of the structure. Generally, a skilled operator places the sensor on the structure and interprets the resulting waveform in order to detect defects. As a consequence, inspection of large areas may be extremely time consuming and defect detection may be difficult for structures that have a complex geometry. Despite recent advances in robotic scanning technology there exists a need for large area scanning systems.

The prerequisites for each application necessitating the use of large area transducers differ in size and shape. The complexities and costs associated with building a single transducer to encompass a large area can be very significant. Furthermore, there are limitations of the manufacturing technologies with regard to the maximum size of the large area transducer that can be profitably manufactured. Additionally, the expenses incurred while repairing the large area transducers may be considerable.

Arrays of transducers may be utilized to circumvent the problems associated with employing single large area transducers. The X-Y plane may be employed for assembling the transducer arrays to facilitate the construction of large area transducer arrays. However, such arrays can be very dense and necessitate a large quantity of control and amplifier electronics to drive the individual transducers of the array. Presently, the control and amplifier electronics employed to drive the individual transducers are also positioned in the X-Y plane resulting in a large footprint and potentially, gaps in the transducer area due to the need to locate electronics in or adjacent to the transducer. Furthermore, the density of input/output (I/O) required for coupling the individual transducers with the associated electronics may be very high. Also, the density of I/O may be too large for traditional interconnect strategies to handle. Presently, the interconnect lengths required to couple the transducer elements to the electronic device are very long. It would be desirable to minimize interconnect lengths in order to circumvent problems associated with longer interconnect lengths, such as, effects of capacitance, and degraded signal quality.

It would therefore be desirable to assemble large area transducer arrays in order to circumvent associated problems, such as, complexities and costs associated with manufacturing and repairing a single large area transducer. Furthermore, it would be desirable to position the associated electronics in close proximity to the individual transducer elements of the transducer array in order to minimize system size, complexity, interconnect lengths and enhance the performance of the transducer arrays.

BRIEF DESCRIPTION

Briefly, in accordance with one embodiment of the present technique, a transducer array is presented. The transducer array includes a substrate comprising a front side and a backside, a plurality of transducers disposed on the front side of the substrate and aligned in a horizontal direction and a vertical direction to form a transducer array, where each one of the plurality of transducers is configured for sensing a corresponding input signal and a plurality of connectors disposed on the backside of the substrate where the connectors are electrically coupled to the plurality of transducers.

According to another aspect of the present technique, a method for fabricating a tiled transducer array is presented. The method comprises fabricating a wafer comprising a plurality of transducers, dicing the wafer to form individual transducers, testing the individual transducers to identify a plurality of known good transducers, preparing a substrate including a front side and a backside, where the backside of the substrate comprises a plurality of connectors, positioning the plurality of known good transducers on the front side of the substrate and aligning the plurality of transducers in a horizontal direction and a vertical direction to form a tiled transducer array, and electrically coupling the connectors on the backside of the substrate to the plurality of known good transducers.

According to a further aspect of the present technique, a stacked transducer array is presented. The stacked transducer array includes an electronic device disposed in a first layer and coupled to a plurality of transducers, where the electronic device is configured for processing a plurality of input signals, a substrate disposed in a second layer and including a front side and a backside, an electrical interconnect layer disposed on the substrate, and a plurality of transducers disposed in a third layer, the plurality of transducers configured for processing a plurality of input signals.

In accordance of another embodiment of the present technique, a method for fabricating a stacked transducer array is presented. The method includes fabricating an electrical interconnect on a substrate having a front side and a backside, disposing a plurality of transducers on the front side of the substrate, and coupling the plurality of transducers on the front side of the substrate to an associated electronic device.

According to another aspect of the present technique, a method for aligning a plurality of electronic devices with a plurality of transducers in a transducer array formed in an X-Y plane is presented. The method includes positioning each of a plurality of electronic devices in a pre-determined direction, aligning the each of the plurality of transducers with a corresponding one of the plurality of electronic devices via a pre-fabricated spacer, and coupling each of the plurality of electronic devices to the corresponding transducer of the transducer array via an interconnect.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
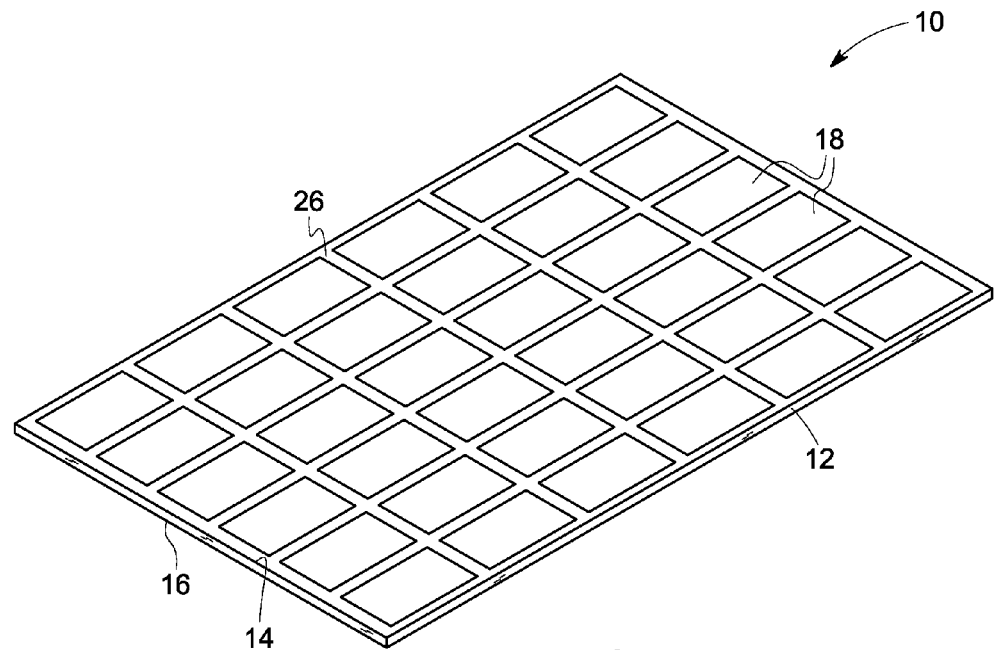
FIG. 1 is a perspective view illustrating the patterning of transducers on a substrate, according to one aspect of the present technique.
Figure 1:
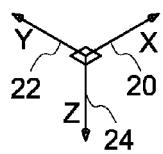

Turning now to the drawings, and referring to FIG. 1, a transducer array 10 that may be used with a system, such as, but not limited to an ultrasound scanner or an x-ray detector, is illustrated. In the illustrated embodiment, the transducer array 10 may be used to sense a plurality of input signals.

In a presently contemplated configuration, as shown in FIG. 1, the transducer array 10 is illustrated diagrammatically as including a substrate 12. The substrate 12 has a front side 14 and a backside 16. Typically, the substrate may include a semiconductor material, such as silicon, or a flexible material, such as polyimide, although other types of materials with similar properties may be used.

Transducers are devices that are generally used to convert at least one of a sound, a temperature, a pressure, a light or other signal to or from an electronic signal. In the exemplary embodiment illustrated in FIG. 1, the transducer array 10 includes a plurality of individual transducers 18 configured to sense a plurality of input signals disposed on the substrate 12. For example, transducers 18 that make up the transducer array 10 may include a plurality of sensor devices, such as, but not limited to, a photodiode, a back-illuminated photodiode, an acoustic sensor, a temperature sensor, or an electromagnetic radiation sensor. Additionally, the transducer elements may also include micro-electro-mechanical systems (MEMs) devices, such as, but not limited to, capacitive micro-machined ultrasonic transducers (cMUTs).

Tiling is an approach that offers an attractive solution to the problems associated with building a large area transducer. An exemplary transducer array, according to the present technique may be constructed by tiling smaller, individual transducer elements 18 to form a large area (X, Y) transducer array.

According to one embodiment of the present technique, a wafer including a plurality of transducer elements is fabricated. The wafer is then diced to form individual transducer elements. The individual transducer elements are then tested and known good transducers are identified as the transducer elements 18 that may be advantageously implemented to build the large area transducer array.

In the illustrated embodiment of FIG. 1, X, Y and Z directions are represented by reference numerals 20, 22 and 24 respectively. The plurality of transducer elements 18 is disposed on the front side 14 of the substrate 12 and is aligned in a row along the horizontal, X-direction 20. Additionally, a plurality of transducer elements 18 is also disposed on the front side 14 of the substrate 12 and is aligned in a column along the vertical, Y-direction 22. In a present configuration, the plurality of transducer elements 18 is patterned in rows and columns in the X-Y plane to form a tiled transducer array 26. The transducer elements 18 may also be electrically coupled to one another in the horizontal 20 and vertical 22 directions. Consequently, disposing a plurality of transducer elements 18 adjacent to one another in a grid pattern results in a large area transducer array that may be employed to envelope a larger area. For example, the large area tiled transducer array 26 may be utilized to image a large area. Further, while the present exemplary embodiment illustrates transducer elements disposed on the substrate, in an alternate exemplary embodiment, the transducer elements may be disposed to form a planar surface of transducers thus minimizing the height of the package.

Alternatively, the transducer array 10, illustrated in FIG. 1, may be constructed during the fabrication process. During the fabrication process, individual transducer elements 18 may be arranged in rows and columns to form a monolithic transducer array.

As previously described, in one exemplary embodiment, the substrate 12 may be fabricated using semiconductor materials. A multi-layer electrical interconnect may be fabricated directly on the semiconductor material. As will be appreciated by those skilled in the art, traces and vias electrically isolated by dielectric materials may be disposed and etched to provide electrically conductive paths among the plurality of transducer elements 18. The transducer elements 18 may be arranged directly on top of the multi-layer electrical interconnect on the semiconductor wafer. The transducer array 26 that has been arranged on the electrical interconnect on the semiconductor wafer may be thinned to expose the bottom layer of interconnect, thus making the transducer array 26 a flexible transducer array with input/output (I/O) on backside 16. Alternatively, through-wafer vias may be drilled through the substrate wafer 12 in order to electrically couple the transducer elements 18 present on the front side 14 of the substrate 12 to the backside 16 of the substrate 12, thereby providing conductive paths from the transducer elements 18 to the backside 16 of the substrate 12. In such an instance the transducer array 26 does not require thinning and may remain rigid for a planar transducer array. Another alternate method is to achieve backside I/O by disposing interconnect on each of the four sides of the monolithic or tiled transducer array. This wrap-around interconnect is disposed around the four sides of the transducer array 10 and brought down along the sides and electrically coupled to the backside 16 of the substrate 12.

In another embodiment of the present technique, the substrate 12 may comprise a flexible material that has been adhered to a flat substrate or a semiconductor wafer for planarity. A multi-layer interconnect may be built on the flexible material. The transducers 18 may then be assembled on top of the interconnect layer. Once the transducers 18 are assembled, the flexible material may be separated from the flat substrate to provide a flexible transducer array. The flexible transducer array can conform to any shape the integrated electronics take.

In both the flexible and semiconductor wafer interconnect methods the interconnect side, that is the backside 16 of the transducer array 26, may be fabricated to facilitate interconnect such that individual integrated electronic devices may be attached to the transducer using solder, conductive bump, wire bond, or some means of electrical interconnect and assembly.

A plurality of connectors is disposed on the backside 16 of the substrate 12. The connectors may include I/O connectors that facilitate the processing of a plurality of signals. Additionally, the connectors are electrically coupled to the transducers 18 disposed on the front side 14 of the substrate 12. The electrical coupling between the connectors and the transducer elements 18 may be achieved by methods such as, but not limited to, through-hole vias, buried I/O that are exposed following thinning of the transducer or substrate, and wraparound interconnect as formed by disposing electrical conductors on the edges of the monolithic or tiled transducer arrays.

Figure 2:
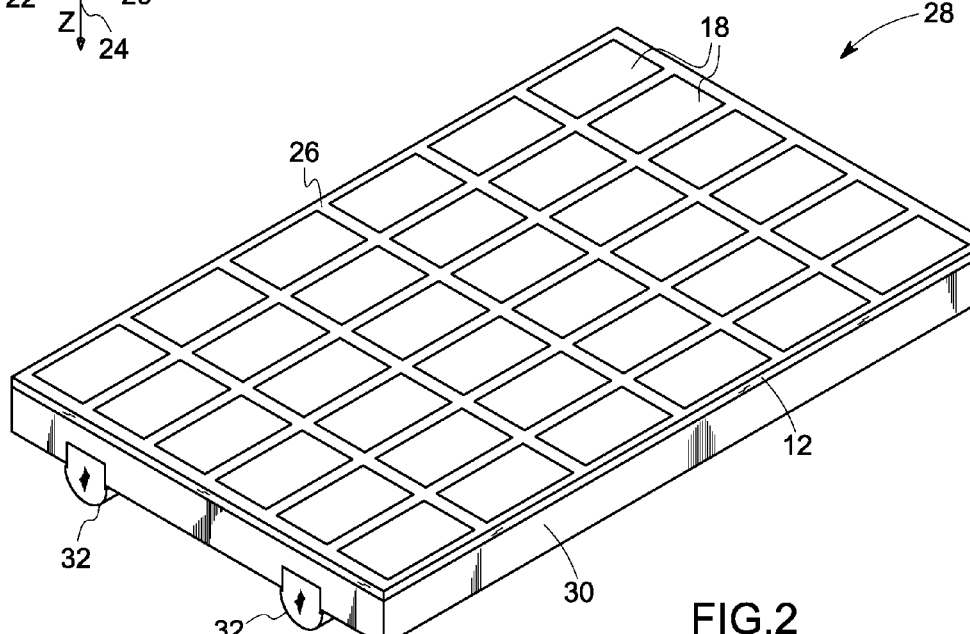
FIG. 2 is a perspective view of one embodiment of a tiled transducer array employing an interposer, in accordance with another aspect of the present technique.
Figure 2:
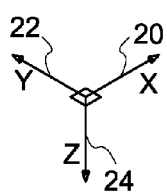

FIG. 2 illustrates another exemplary embodiment 28 of the present technique. In FIG. 2, the transducer array 26 is shown including an interposer 30. The interposer is configured to facilitate electrical coupling between the plurality of transducers 18 and an electronic device. The interposer 30 may have a substrate including a semiconductor material. Alternatively, the interposer 30 may include a composite of one or more support layers and one or more interconnect layers. The "support layers" may include material provided for a purpose other than purely electrical interconnection or electrical isolation. For instance, the support layers may include an acoustic backing material configured to dampen acoustical reflections. In other applications, the support layers may include materials with desirable thermal properties. In still other applications, the support layers may include materials configured to provide further mechanical support.

The interposer 30 may also be fabricated from a material comprising one of a polyimide, an aramid, a fluorocarbon, or a polyester. Furthermore, the interposer 30 may include a multi-layer interconnect system configured to facilitate electrical coupling between the plurality of transducers 18 and an electronic device which may be coupled to the backside of the interposer 30, as described further below. Additionally, the interposer layer 30 may be attached to another layer via the solder bumps 32 or alternate interconnect structures positioned on a side of the interposer 30.

Figure 3:
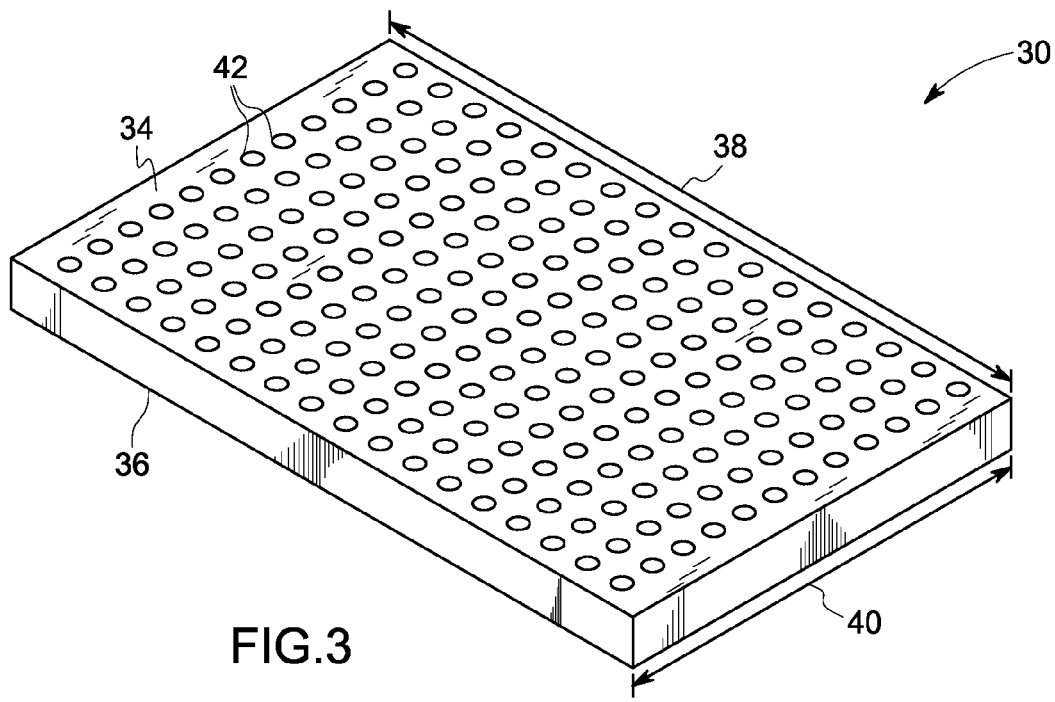
FIG. 3 is a perspective view illustrating a first side of the interposer shown in FIG. 2.

Turning now to FIG. 3, the interposer 30 of FIG. 2 is illustrated as including a first side 34 and a second side 36. Furthermore, the interposer 30 also includes a length 38 and a width 40, which may be approximately equivalent to a length and width of the substrate 12. The first side 34 of the interposer 30 includes a plurality of connectors 42. In one exemplary embodiment, the connectors 42 may comprise vias having metal disposed therein to provide an electrical path from the first side 34 to the second side 36. As will be appreciated by those skilled in the art, an anisotropic or an isotropic electrically conductive adhesive, such as a paste or film, may be disposed over the first side 34 of the interposer 30 to provide a physical, as well as electrical connection between the interposer 30 and the substrate 12. Alternatively, an electrically conductive paste or metal, such as solder, may be disposed on each of the connectors 42 to provide a mechanism for coupling the interposer 30 to the substrate 12. The connectors 42 on the first side 34 of the interposer 30 may be employed to connect the interposer 30 to the connectors of a device to which the interposer is to be attached. For example, the connectors 42 positioned on the first side 34 of the interposer 30 enable the coupling between the interposer 30 and connectors on the backside 16 of the substrate 12. Additionally, metal to metal interconnect may be formed employing thermal, ultrasonic or thermosonic bonding.

Figure 4:
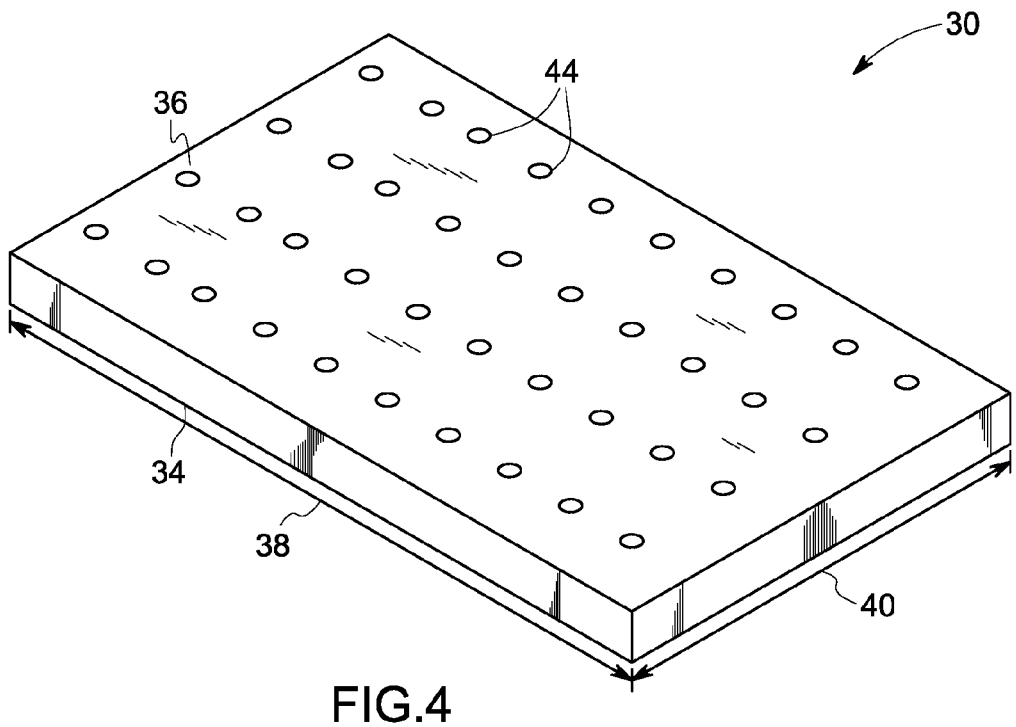
FIG. 4 is a perspective view illustrating a second side of the interposer shown in FIG. 2.

FIG. 4 illustrates the second side 36 of the interposer 30. Connectors 44 that are formed on the second side 36 of the interposer 30 enable the coupling between the second side 36 of the interposer 30 and a component to which the interposer 30 is coupled, such as control and amplifier electronics, as described further below.

According to one embodiment of the present technique, the X-Y plane is employed for patterning the transducer elements 18 to facilitate the construction of large area transducer arrays. Conventionally, the control and amplifier electronics employed to drive the individual transducers are also positioned in the X-Y plane resulting in a large footprint. Moreover, it is desirable to minimize interconnect lengths in order to circumvent poor performance associated with longer interconnect lengths, such as, effects of capacitance, and degraded signal quality.

The performance of the transducer array 26 may be greatly enhanced by minimizing the interconnect lengths between the transducer elements 18 and the associated amplifier and control electronics, which may be achieved by positioning the electronic devices in close proximity to the transducer elements 18 in the Z-direction 24. The method of growing the transducer array 26 in the Z-direction 24 results in the formation of a three-dimensional transducer array, to implement high volumetric density.

Large area transducer arrays 26 entail control and amplification of the individual transducer elements 18. Generally, the control and amplifier electronic devices are built employing semiconductor processing such as a Complementary Metal Oxide Semiconductor (CMOS) process. However, the semiconductor processing for the electronics may yield differently than the large area transducer array. Typically, the electronics yield is better at the center of the wafer than at the edges of the wafer. Therefore, it may be advantageous to fabricate the electronics elements separately from the transducer elements 18, using any desirable processing method, and coupling the electronics array or individual electronic devices to the second side 36 of the interposer 30. By fabricating the electronics array separately and isolating the electronics array to a layer other than that of the transducer array, optimal fabrication techniques may be chosen for each array. As with the transducer array, the electronic devices that make up the electronics array may be tested such that the known good die may be implemented. As will be appreciated, the corresponding smaller electronic devices may be stacked, in the Z-direction 24, in close proximity to the individual transducer elements 18 to form a fully functional large area transducer array 26, as illustrated further below with respect to FIGS. 5-7.

Figure 5:
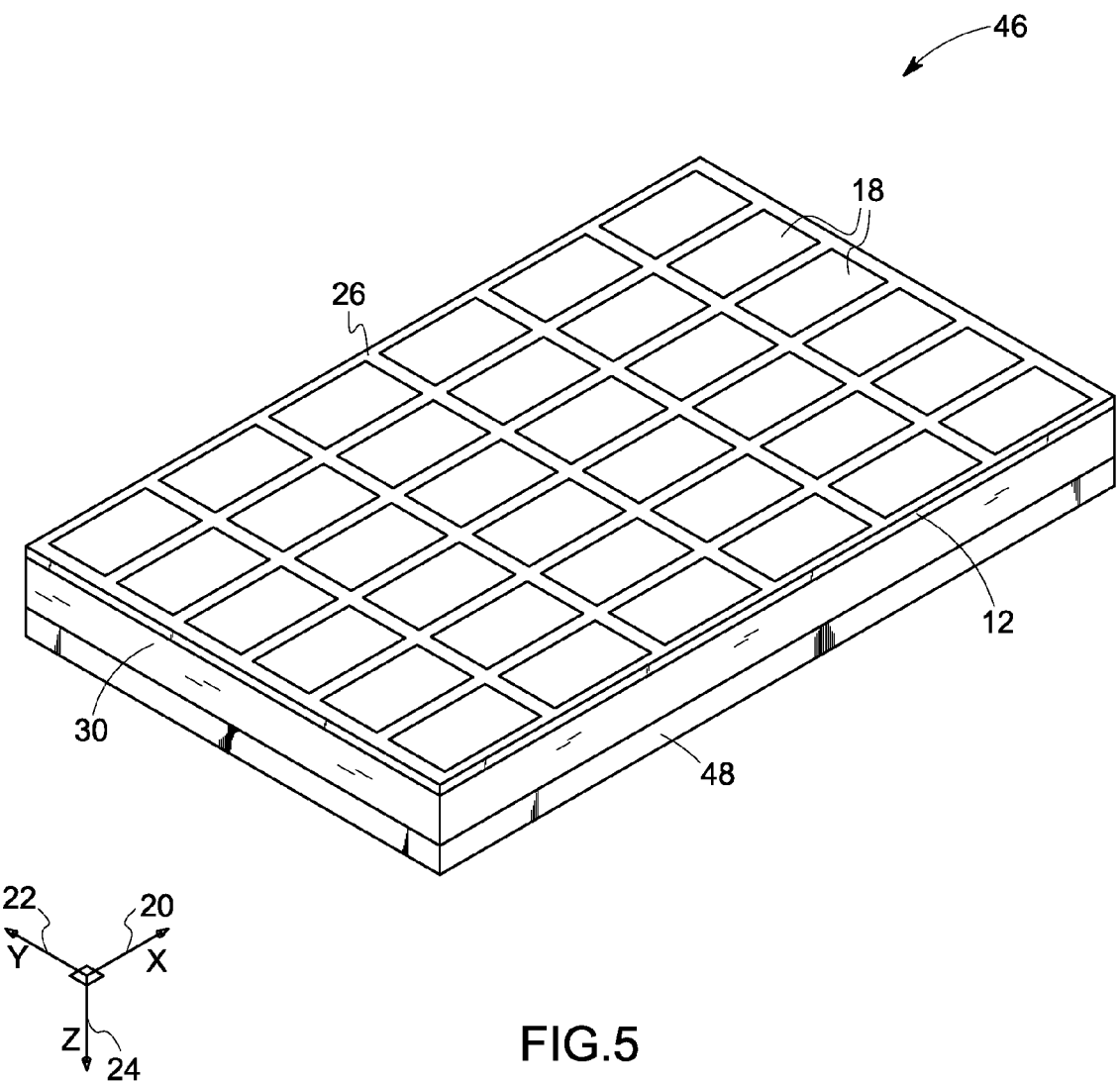
FIG. 5 is a perspective view illustrating the stacking of an electronic device on the transducer array assembly exemplified in FIG. 2, according to a further aspect of the present technique.

FIG. 5 illustrates an exemplary embodiment of a stacking assembly 46. In FIG. 5, an electronics array formed as a single electronic device 48 is illustrated as being stacked under the transducer array 26, in the Z-direction 24. The electronic device 48 may include control and amplifier devices, for instance. As illustrated in FIG. 5, the transducer elements 18 may be tiled on the front side 14 (see FIG. 1) of a substrate 12. Furthermore, as illustrated in a presently contemplated configuration, the stacked assembly 46 may also include an interposer 30, which includes a multi-layer interconnect system. The interposer 30 is employed to facilitate the electrical coupling between the plurality of transducers 18 and the electronic device 48. Alternatively, the transducer elements 18 may also be patterned directly on the interposer 30, according to one aspect of the present technique. Furthermore, a multi-layer interconnect disposed on the substrate 12 may also suffice to provide the coupling between the transducer elements 18 and the electronic device 48. The electronic device 48 may be a signal processor.

Figure 6:
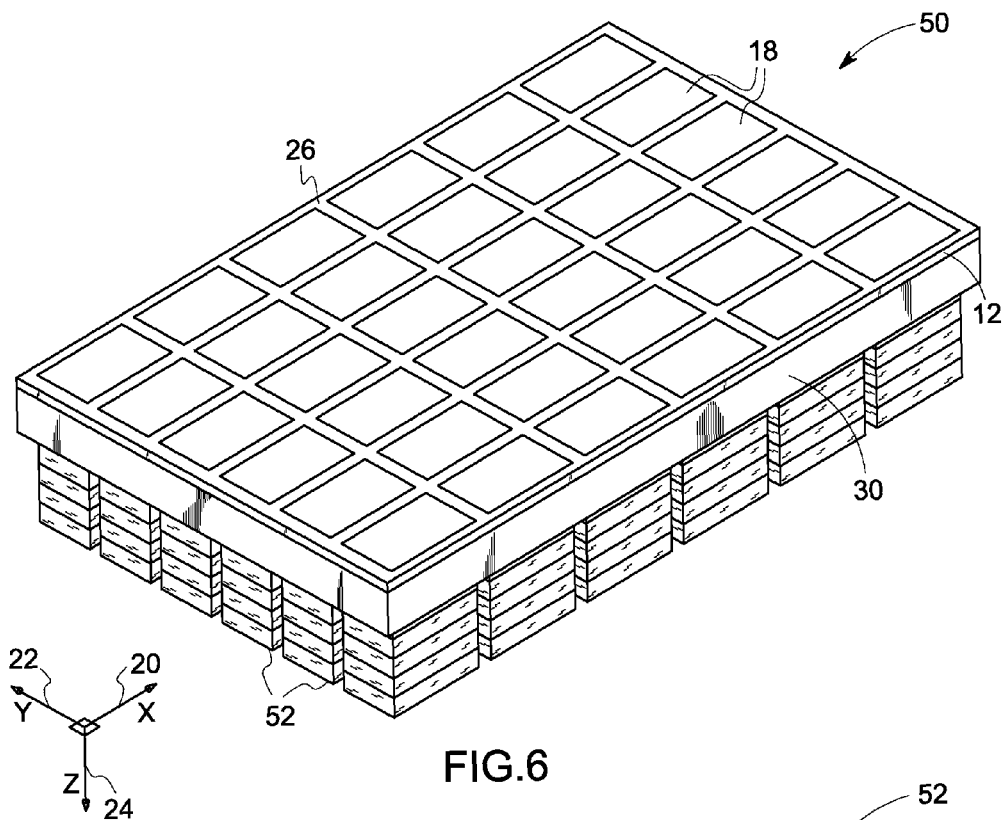
FIG. 6 is a perspective view illustrating the stacked assembly exemplified in FIG. 5 where the electronic device is illustrated as a stack of electronic devices, according to yet another aspect of the present technique.

In order to minimize the adverse effects of long interconnect lengths, the associated electronics are positioned directly below the transducer elements 18. In a presently contemplated configuration, as shown in FIG. 6, a second stacked three-dimensional assembly 50 is illustrated as including a plurality of transducers 18 disposed on the front side 14 (see FIG. 1) of a substrate 12, an interposer 30 through which a multi-layer interconnect system is fabricated, and an electronics array that includes a plurality of stacked electronic devices 52. Furthermore, according to an aspect of the present technique, an electronics array formed as a plurality of stacked electronic devices 52 is illustrated in FIG. 6. The multi-layer interconnect system disposed on the interposer 30 facilitates electrical coupling between the individual transducer elements 18 positioned on the front side 14 of the substrate 12 and the associated electronic devices 52. According to a further aspect of the present technique, the electronic devices 52 are shown as being positioned directly below the associated transducer element 18 that the stacked electronic device 52 is configured to drive.

Figure 7:
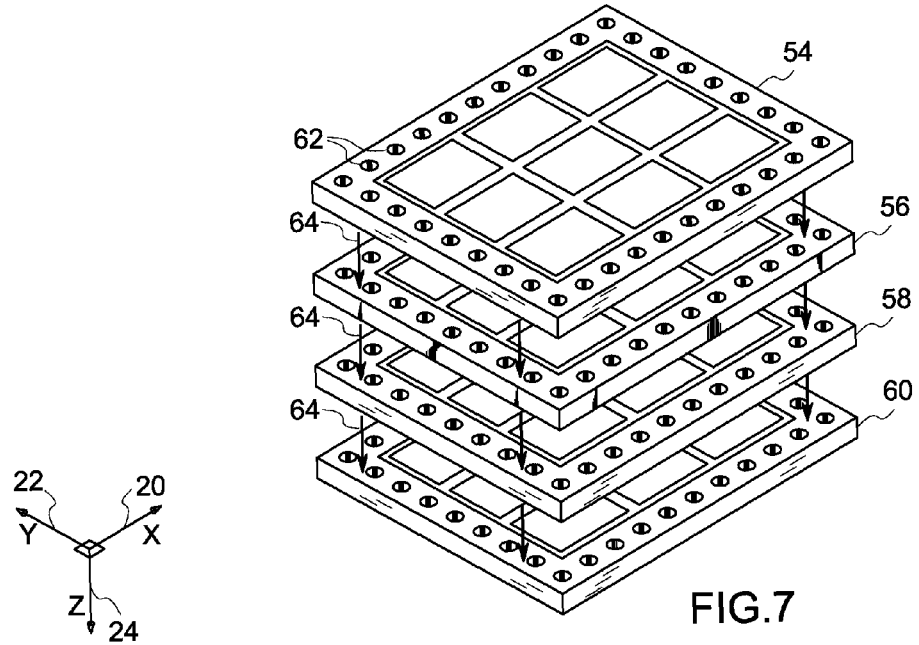
FIG. 7 is a diagrammatical view illustrating an embodiment for the stacking of electronic devices in the Z-direction.

The stacked electronic devices 52 may include a multi-layer, three-dimensional stack of various amplifier and control electronics that may be employed to drive the individual transducer elements 18 of the transducer array 26. According to one aspect of the present technique illustrated in FIG. 7, an exemplary embodiment of stacking a plurality of electronic devices to form stacked electronic devices 52 is provided. FIG. 7 illustrates the stacked electronic device 52 as including four separate layers of electronic devices. For example, a first layer 54 may include high-voltage analog circuits. Furthermore, a second layer 56 may include an array of pursers. In addition, a third layer 58 may be an array of beam formers. Also, a fourth layer 60 may include signal processors. Additionally, layer-to-layer interconnect may be accomplished by means of a plurality of through-hole vias 62 located along the periphery of the electronic device layers 54, 56, 58 and 60. Moreover, as illustrated in FIG. 7, the four layers 54, 56, 58 and 60 are stacked one on top of the other in a direction 64 that is the Z-direction 24. Alternatively, the through-hole vias 62 may be arranged in other configurations, such as through the middle region of each layer 54, 56, 58 and 60. As will be appreciated, any suitable means of electrically connecting each of the layers 54, 56, 58 and 60 may be implemented.

The placement or stacking of the electronic devices 52, on the backside of a large area transducer array 26 may provide advantages to circumvent issues related with long interconnect lengths. It may be desirable to align the stacked electronic devices 52 with the associated transducer element 18. Pre-fabricated spacers (not shown) may be employed to align the stacked electronic devices 52 in a more precise grid on the backside of the transducer array 26, according to another embodiment of the present technique, as described further with respect to FIG. 8. Furthermore, materials properties of the transducer, electronics, and interconnect materials may be chosen or utilized to facilitate precision alignment and assembly of the transducer arrays with stacked electronics.

Figure 8:
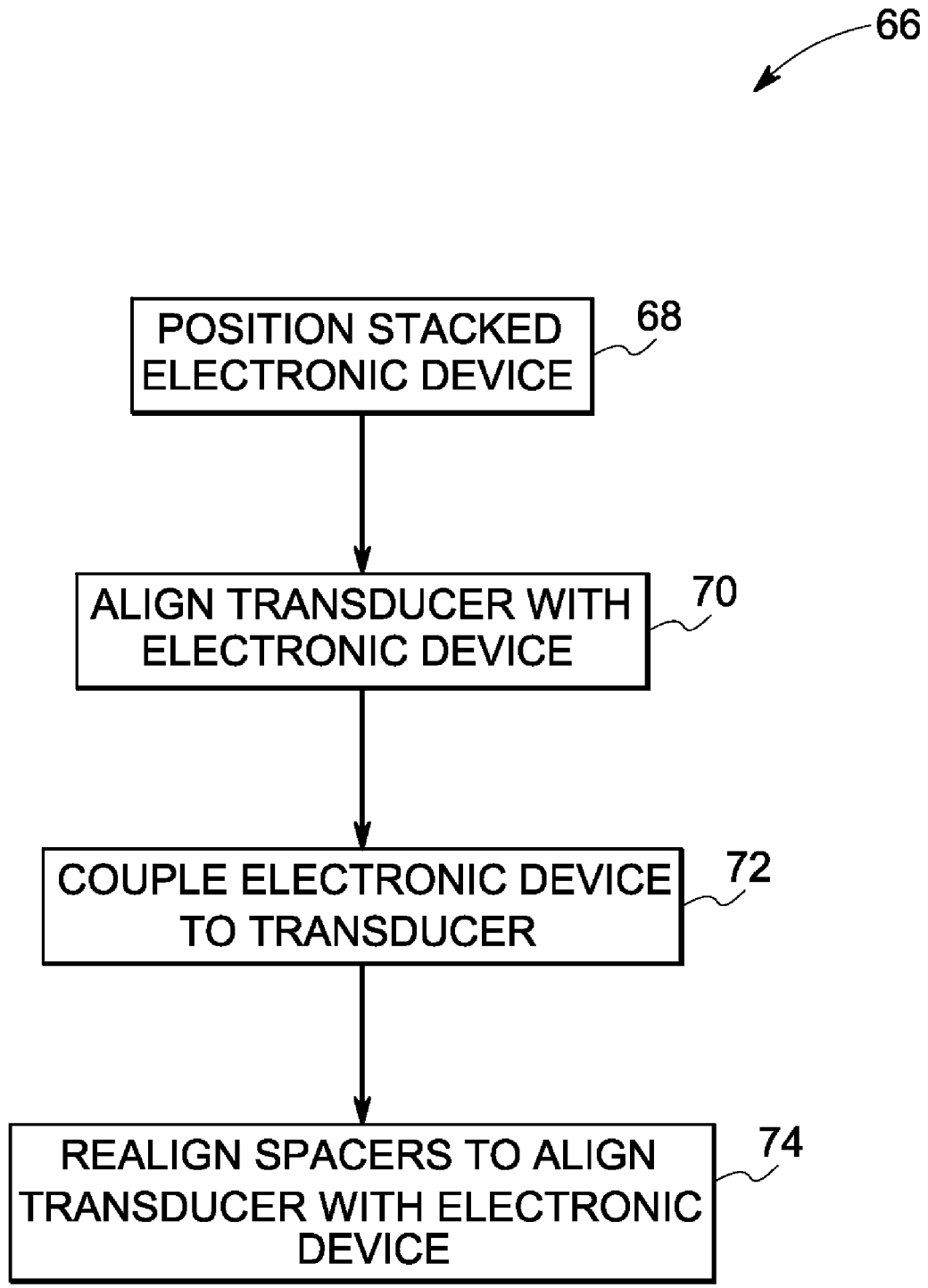
FIG. 8 illustrates steps for aligning the transducer elements and the associated electronic devices, according to an aspect of the present technique.

FIG. 8 is a flow chart 66 illustrating steps for aligning the stacked electronic device 52 (see FIG. 6) with an associated transducer element 18 (see FIG. 6), in accordance with one embodiment. The method summarized in FIG. 8 begins at step 68 where the positioning of the stacked electronic device 52 is performed. The stacked electronic device 52 is positioned along the Z-direction 24 (see FIG. 6) with respect to the transducer element 18 that the stacked electronic device 52 is configured to drive.

Following step 68, step 70 is performed. In step 70, pre-fabricated spacers may be employed to space the plurality of stacked electronic devices 52 in a precise grid on the backside of the transducer array 26 (see FIG. 6).

Subsequently, step 72 is performed where the electronic device 52 is coupled to the corresponding transducer element 18. The coupling of the electronic device 52 to the corresponding transducer element 18 may be accomplished by means of interconnect activation methods, such as, but not limited to, heat and pressure for solder reflow.

Step 74 involves the realignment of the pre-fabricated spacers in order to align the transducer elements 18 with their corresponding stacked electronic devices 52. Subsequent to performing the activation step 72, gaps may arise in the alignment between the individual transducer elements 18 and the relevant electronic devices 52. The temporary spacers may now be realigned to reduce the gaps that have arisen during the activation step 72. In certain sensor applications the gaps in the transducer array 26 may be acceptable. However, the gaps between the stacked electronic devices may be filled with materials that enhance the performance of the transducer. For instance, in an acoustic transducer, acoustic damping material may be disposed within the gaps and positioned to minimize acoustic reflections in the gap.

The large area transducer array 26 and the method of constructing the large area transducer array 26 described hereinabove enable the fabrication of three-dimensional, large area transducer arrays, which may find application in various fields such as medical diagnostic systems, medical and industrial imaging and the non-destructive evaluation and inspection of materials and structures. Furthermore, employing multi-layer interconnect systems disposed either on the substrate 12 or on the interposer 30, greatly facilitates the assembly and performance of transducers and electronics with high densities of I/O connectors.

In addition, by positioning the electronic devices 52 in close proximity to the transducer elements 18, the system function and performance may be greatly enhanced. Such improvements are a consequence of minimized interconnect lengths and appropriate alignment of the electronic devices 52 with the associated transducer elements 18. Moreover, stacking the associated electronic devices 52 in the Z-direction 24 results in higher functional density for a given package volume. Still further, by forming packages wherein each of the functional blocks of the package is isolated by fabrication in a separate layer, optimized fabrication techniques for each type of functional block may be implemented.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for fabricating a tiled transducer array, the method comprising:
fabricating a wafer comprising a plurality of transducers;
dicing the wafer to form individual transducers;
testing the individual transducers to identify a plurality of known good transducers;
preparing a substrate having a front side and a backside, wherein the backside of the substrate comprises a plurality of connectors;
positioning the plurality of known good transducers on the front side of the substrate and aligning the plurality of transducers in a horizontal direction and a vertical direction to form a transducer array; and
electrically coupling the connectors on the substrate to the plurality of known good transducers, wherein the connectors are arranged such that each of the plurality of known good transducers may be electrically coupled to an electronic device disposed on the backside of the substrate, through a respective one or more of the plurality of connectors.

2. The method of claim 1, comprising connecting the electronic device to the plurality of know good transducers via the connectors.

3. The method of claim 1, wherein the substrate comprises a semiconductor material.

4. The method of claim 1, wherein the substrate comprises a flexible material.

5. The method of claim 1, wherein positioning the plurality of known good transducers on the front side of the substrate and aligning the plurality of transducers in the horizontal direction and the vertical direction to form the transducer array comprises aligning the transducers in the horizontal direction with a spacer.

6. The method of claim 5, comprising aligning the transducers with the electronic device by realigning the spacers with the electronic device after connecting the electronic device to the plurality of known good transducers.

7. The method of claim 1, comprising coupling a support layer configured to dampen acoustic reflections to the substrate.

8. The method of claim 1, wherein a transducer in the plurality of transducers comprises a light sensor.

9. The method of claim 1, wherein a transducer in the plurality of transducers comprises a heat sensor.

10. The method of claim 1, wherein a transducer in the plurality of transducers comprises an acoustic sensor.

11. A method for fabricating a stacked three-dimensional transducer array, the method comprising:
obtaining a substrate having a front side, a backside, and an electrical interconnect providing an electrical path from the front side of the substrate to the backside of the substrate;
disposing a plurality of transducers on the front side of the substrate; and
coupling the plurality of transducers on the front side of the substrate to an associated electronic device on the backside of the substrate through the electrical interconnect.

12. The method of claim 11, further comprising positioning an interposer between the plurality of transducers and the electronic device.

13. The method of claim 11, wherein the stacked transducer array is a three-dimensional array.

14. A method of aligning a plurality of electronic devices with a plurality of transducers in a transducer array disposed generally in an X-Y plane, the method comprising:
positioning each of a plurality of electronic devices so they are aligned in a direction;
aligning each of the plurality of transducers with at least one of the plurality of electronic devices via a pre-fabricated spacer; and
coupling each of the plurality of electronic devices to the transducer array via an interconnect.

15. The method of claim 14, wherein positioning comprises stacking the electronic devices in the direction.

16. The method of claim 14, wherein the direction is the Z-direction.

17. The method of claim 14, further comprising realigning the pre-fabricated spacers to adjust gaps between each of the plurality of transducers and the at least one of the plurality of electronic devices.

18. The method of claim 14, further comprising coupling the plurality of electronic devices and the plurality of transducers to a non-destructive testing system.

19. The method of claim 14, further comprising coupling the plurality of electronic devices and the plurality of transducers to an imaging system.

20. The method of claim 19, wherein the imaging system comprises an x-ray imaging system.

* * * * *

UNITED STATES PATENT AND TRADEMARK OFFICE
CERTIFICATE OF CORRECTION

| | | |
|---|---|---|
| PATENT NO. | : 7,867,824 B2 | Page 1 of 1 |
| APPLICATION NO. | : 12/117608 | |
| DATED | : January 11, 2011 | |
| INVENTOR(S) | : Fisher et al. | |

It is certified that error appears in the above-identified patent and that said Letters Patent is hereby corrected as shown below:

In Column 7, Line 25, delete "pursers." and insert -- pulsers. --, therefor.

In Column 8, Line 64, in Claim 2, delete "know" and insert -- known --, therefor.

Signed and Sealed this
Twenty-sixth Day of April, 2011

David J. Kappos
*Director of the United States Patent and Trademark Office*